United States Patent [19]

Aldridge

[11] Patent Number: 4,688,263
[45] Date of Patent: Aug. 18, 1987

[54] INTEGRATED AM-FM MIXER

[75] Inventor: Fredrick A. Aldridge, Russiaville, Ind.

[73] Assignee: General Motors Corporation, Detroit, Mich.

[21] Appl. No.: 834,920

[22] Filed: Feb. 28, 1986

[51] Int. Cl.[4] ............................................. H04B 1/26
[52] U.S. Cl. ................................. 455/142; 455/189; 455/315; 455/333; 455/326
[58] Field of Search ............... 455/142, 144, 189, 190, 455/314, 315, 326, 332, 333

[56] References Cited

U.S. PATENT DOCUMENTS

| | | | |
|---|---|---|---|
| 3,665,507 | 5/1972 | Peil | 455/142 |
| 3,702,968 | 11/1972 | Sawairi et al. | 455/142 |
| 4,058,771 | 11/1977 | Ohsawa et al. | 455/333 |
| 4,313,221 | 1/1982 | Mattfeld | 455/333 |
| 4,344,188 | 8/1982 | Tanabe et al. | 455/333 |
| 4,480,337 | 10/1984 | Graziadei et al. | 455/333 |

Primary Examiner—Jin F. Ng
Attorney, Agent, or Firm—Robert M. Sigler

[57] ABSTRACT

A mixer is disclosed for use in a dual conversion AM-FM radio receiver in which AM and FM broadcast RF signals from a first IF amplifier are converted by the mixer from a first intermediate frequency to a second intermediate frequency for amplification in a second IF amplifier. A double balanced mixer circuit receives a signal at the first intermediate frequency and a local oscillator signal to generate signals at the second intermediate frequency on its two complementary outputs. One of the outputs is connected to the second IF stage through a narrow bandpass ceramic filter at the second intermediate frequency and a transistor switch. The other output is connected to the second IF stage through another transistor switch. The transistor switches are responsive to an external signal to alternatively connect the output through the ceramic filter for AM signals and the other output for FM signals. Both AM and FM outputs terminate in a single low impedance terminal with constant DC level for connection to the second IF amplifier.

4 Claims, 2 Drawing Figures

4,688,263

INTEGRATED AM-FM MIXER

BACKGROUND OF THE INVENTION

This invention relates to a mixer for use in an AM-FM radio receiver and particularly to such a mixer adapted for use in an integrated circuit in which there is as much integration as possible between the AM and the FM circuitry.

In some radios, a significant amount of common circuitry is possible in the AM and FM signal paths. For example, a dual conversion AM-FM radio receiver of the type wherein the first VCO converts AM signals up and FM signals down to a common first IF frequency of 10.7 MHz may include a common first IF section and a common second IF section at 450 KHz. The mixer which converts the first intermediate frequency signal down to the second intermediate frequency signal appears between the first and second IF sections and ideally would be common to AM and FM signal paths. However, the output of this mixer must, for AM signals, pass through a relatively narrow ceramic bandpass filter at 450 KHz; whereas the FM signal output needs a wider passband. Thus it is desired to provide a single mixer between the first and second IF sections which allows separate output paths for AM and FM signals.

SUMMARY OF THE INVENTION

The mixer of the invention is adapted for use in a dual conversion AM-FM radio receiver of the type in which AM and FM broadcast RF signals are converted to a common first intermediate frequency for amplification in a first IF amplifier and then converted by the mixer to a second intermediate frequency for amplification in a second IF amplifier, the AM and FM outputs of the mixer requiring bandpass filtering of different passband widths. A double balanced mixer circuit has a first input terminal for local oscillator signal, a second input terminal for the signal at the first intermediate frequency and a pair of output terminals for complementary signals at the second intermediate frequency. The input of a narrow bandpass filter is connected to one of the output terminals of the double balanced mixer circuit. First output transistor means include an input terminal connected to the output of the narrow bandpass filter and an output terminal; and second output transistor means include an input terminal connected to the other output terminal of the double balanced mixer circuit and an output terminal connected to the output terminal of the first transistor means. Transistor switch means are responsive to an external signal to alternatively activate the first output transistor means only when the first IF signal is an AM signal and the second output transistor means only when the first IF signal is an FM signal. Therefore, a high degree of common circuitry is achieved between the AM and FM signal paths; but only AM signals are passed through the narrow bandpass filter. Further details and advantages will be apparent from the accompanying drawings and following description of a preferred embodiment.

DESCRIPTION OF THE PREFERRED EMBODIMENT

Figure 1:
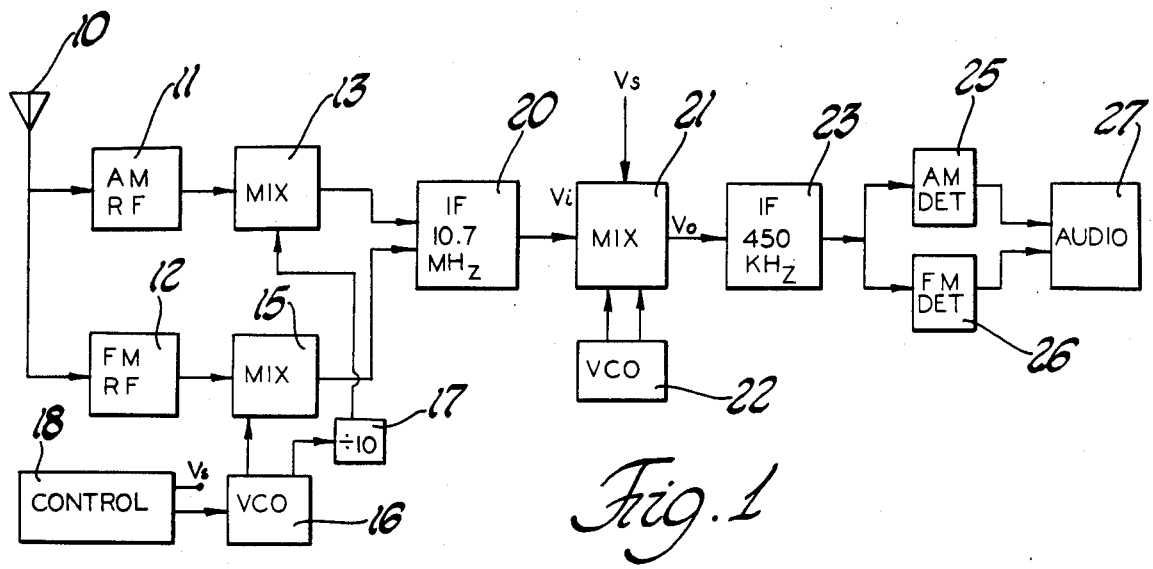
FIG. 1 is a block diagram of a dual conversion AM-FM radio receiver in which the mixer of the invention may be used.

FIG. 1 shows a dual conversion AM-FM radio receiver. An antenna 10 is adapted to provide AM or FM radio frequency signals to AM RF stage 11 and FM RF stage 12, each of which stages includes amplification optimized for the appropriate broadcast frequency band. A mixer 13 receives the output of AM RF stage 11; and another mixer 15 receives the output of FM RF stage 12. Neither of these is the mixer of the invention. Mixers 13 and 15 convert the AM or FM received frequencies to a common first intermediate frequency of 10.7 MHz. To accomplish this, a VCO 16, a divide circuit 17 and a control 18 are provided. For AM reception, VCO 16 oscillates at a frequency from 112 to 123 MHz as set by a control voltage signal from control 18, which may be a programmed microcomputer. This is divided by ten in divide circuit 17 for a range of 11.2 to 12.3 MHz and applied to the local oscillator input of mixer 13 to tune the broadcast AM band of 500 to 1600 KHz and convert it upward to 10.7 MHz. For FM reception, VCO 16 is adjustable by control 18 over a slighlty different range: from 98 to 119 MHz. This is effective to convert FM broadcast frequencies downward to the first intermediate frequency of 10.7 MHz.

The outputs of both mixer 13 and mixer 15 are connected to the input of a first IF stage 20, in which the converted signal at 10.7 MHz is amplified. The output of first IF stage 20 is provided to the signal input of a mixer 21, which is the mixer of this invention. Mixer 21 also receives a local oscillator signal from VCO 22 and an AM-FM switch signal Vs from control 18. In mixer 21 the signal is converted downward to a second intermediate frequency of 450 KHz for amplification in a second IF stage 23. From second IF stage 23, the signal is sent to either AM detector 25 or FM detector 26 and then to audio stage 27.

Figure 2:
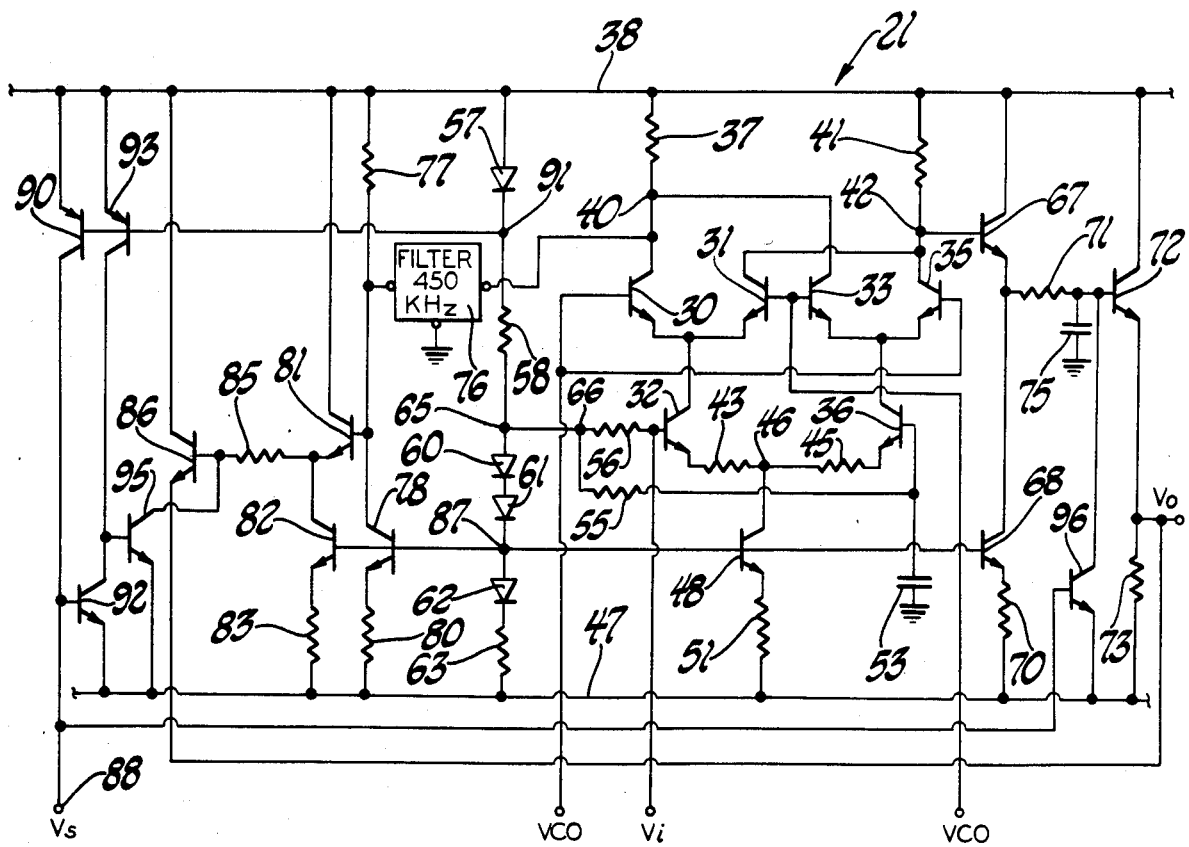
FIG. 2 is a circuit diagram of the mixer of the invention.

FIG. 2 shows the detailed circuitry of mixer 21. NPN transistors 30, 31, 32, 33, 35 and 36 comprise a double balanced mixer circuit. Transistors 30 and 31 have emitters connected together and to the collector of a transistor 32; while transistors 33 and 35 have emitters connected together and to the collector of a transistor 36. The bases of transistors 30 and 35 are connected together and form one input of a local oscillator signal VCO from VCO 22. Likewise, the bases of transistors 31 and 33 are connected together and form the other input for the local oscillator signal VCO from VCO 22. The collectors of transistors 30 and 33 are connected together through a resistor 37 to B× supply line 38 and form a first output terminal 40. Likewise, the collectors of transistors 31 and 35 are connected together through a resistor 41 to B× supply line 38 and form a second output terminal 42. Resistors 37 and 41 are impedances having equal impedance (resistance) values.

The emitters of transistors 32 and 36 are coupled together through a series pair of resistors 43 and 45, the junction 46 of which is connected to chip ground line 47 through a current source NPN transistor 48 having a base connnected to a voltage reference circuit to be identified below. Transistor 48 has a collector connected to junction 46 and an emitter connected to line 47 through a resistor 51. The base of transistor 36 is connected through a capacitor 53 to off-chip ground and through a series pair of resistors 55 and 56 to the base of transistor 32, which also provides a signal input for the first IF signal Vi.

The previously mentioned voltage reference circuit comprises, in series from B+ supply line 38 to chip ground line 47, diode 57, resistor 58, diode 60, diode 61, diode 62 and resistor 63, with all diodes forward biased. Junction 65 of resistor 58 and the anode of diode 60 is connected to the junction 66 of resistors 55 and 56. Junction 87 of the cathode of diode 61 and the anode of diode 62 is connected to the base of transistor 48, along with several others not yet identified. Thus the DC voltage level on the bases of transistors 32 and 36 is maintained two diode drops above the base of transistor 48. The double balanced mixer and voltage reference circuits are themselves of standard circuit design. Generally either a single ended output is taken from one of the double balanced mixer outputs or a dual complementary output is taken from both and provided to a complementary input for the next stage.

An output circuit for FM signals includes an NPN transistor 67 having a collector connected to B+ supply line 38, a base connected to output terminal 42 of the double balanced mixer and an emitter connected to the collector of a current source NPN transistor 68 having an emitter connected through a resistor 70 to chip ground line 47 and a base connected to junction 87. The emitter of transistor 67 is further connected through a resistor 71 to the base of an NPN transistor 72 having a collector connected to B+ supply line 38 and an emitter connected through a resistor 73 to chip ground line 47. A capacitor 75 is connected from the base of transistor 72 to external ground. Capacitor 75 and resistor 71 together comprise a low pass filter to reduce oscillator frequency components. The emitter of transistor 72 further serves as an output terminal for the second IF signal Vo. Signals from this output are filtered by means not shown in second IF stage 23 having a passband wide enough for FM signal processing.

An output circuit for AM signals includes a narrow bandbass ceramic filter 76 at 450 KHz, which has an input connected to output 40 of the double balanced mixer and an output connected through a resistor 77, an impedance having an impedance (resistance) value equal to that of resistors 37 and 41, to B+ supply line 38 and to the collector of a current source NPN transistor 78 having an emitter connected to chip ground line 47 through a resistor 80 and a base connected to junction 87. Transistor 78 sources a current half that of transistor 48; and resistors 37 and 77 are designed to terminate filter 76. The output of filter 76 is further connected to the base of an NPN transistor 81 having a collector connected to B+ supply line 38 and an emitter connected to the collector of a current source NPN transistor 82, which has an emitter connected through a resistor 83 to chip ground line 47 and a base connected to junction 87. The emitter of transistor 81 is further connected through a resistor 85 to the base of an NPN transistor 86 having a collector connected to B+ supply line 38 and an emitter connected to the emitter of transistor 72 to provide a common output for the second IF signal Vo, regardless of whether it is an AM or an FM signal. However, signals from the output described in this paragraph are filtered with a narrow passband at 450 KHz.

An AM-FM select signal Vs is provided to a select terminal 88 connected to the collector of a PNP transistor 90 having an emitter connected to B+ supply line 38 and a base connected to a junction 91 of the cathode of diode 57 and resistor 58. Terminal 88 is further connected to the base of an NPN transistor 92 having an emitter connected to chip ground line 47 and a collector connected to the collector of a PNP transistor 93 with an emitter connected to B+ supply line 38 and a base connected to junction 91. The collector of transistor 92 is further connected to the base of an NPN transistor 95 having an emitter connected to chip ground line 47 and a collector connected to the base of transistor 86. Terminal 88 is further connected to the base of an NPN transistor 96 having an emitter connected to chip ground line 47 and a collector connected to the base of transistor 72. A high voltage Vs, corresponding to AM operation, on terminal 88 causes transistors 92 and 96 to turn on and transistor 95 to turn off. Transistor 96 pulls the base of transistor 72 to ground so that only transistor 86 is free to conduct and the narrow bandpass output is activated. Alternatively, a low voltage Vs, corresponding to FM operation, on terminal 88 causes transistors 92 and 96 to turn off and transistor 95 to turn on. The base of transistor 86 is pulled to ground; and the wider bandpass output is activated through transistor 72.

The embodiments of the invention in which an exclusive property or privilege is claimed are defined as follows:

1. A mixer for use in a dual conversion AM-FM radio receiver of the type in which AM and FM broadcast RF signals are converted to a common first intermediate frequency for amplification in a first IF amplifier and then converted by the mixer to a second intermediate frequency for amplification in a second IF amplifier, the AM and FM outputs of the mixer requiring bandpass filtering of different passband widths, the mixer comprising, in combination:

a double balanced mixer circuit having a first input terminal for a local oscillator signal, a second input terminal for the signal at the first intermediate frequency and a pair of output terminals for complementary signals at the second intermediate frequency;

a narrow bandpass filter having an input connected to one of the output terminals of the double balanced mixer circuit;

first output transistor means having an input terminal connected to the output of the narrow bandpass filter and an output terminal;

second output transistor means having an input terminal connected to the other output terminal of the double balanced mixer circuit and an output terminal connected to the output terminal of the first transistor means;

transistor switch means responsive to an external signal to alternatively activate the first output transistor means only when the first IF signal is an AM signal and the second output transistor means only when the first IF signal is an FM signal, whereby only AM signals are passed through the narrow bandpass filter.

2. The mixer of claim 1 wherein the first intermediate frequency is substantially 10.7 MHz and the second intermediate frequency is substantially 450 KHz.

3. A mixer for use in a dual conversion AM-FM radio receiver of the type in which AM and FM broadcast RF signals are converted to a common first intermediate frequency for amplification in a first IF amplifier and then converted by the mixer to a second IF amplifier, the AM and FM outputs of the mixer requiring bandpass filtering of different passband widths, the mixer comprising, in combination:

a double balanced mixer circuit comprising a first pair of transistors having emitters connected in common to first transistor current source means, bases providing at least a first input terminal for the first intermediate frequency signal and collectors, the double balanced mixer circuit further comprising second and third pairs of transistors, the second pair having emitters connected in common to the collector of one of the first pair of transistors, the third pair having emitters connected in common to the collector of the other of the first pair of transistors, the second and third pairs of transistors having first transistors with collectors connected in common through a first impedance to a supply voltage and providing a first output terminal and second transistors with collectors connected in common through a second impedance to the supply voltage and providing a second output terminal, the bases of the second and third pairs of transistors providing an input for the signal at a local oscillator signal frequency, the first and second impedances being of equal impedance value;

a narrow ceramic bandpass filter having an input connected to the first output terminal of the double balanced mixer circuit and an output connected through a third impedance, equal to the first and second impedances, to the supply voltage and further connected to second transistor current source means providing half the current of the first current source means, the narrow ceramic bandpass filter being terminated by the first and third impedances;

first output transistor means having an input terminal connected to the output of the narrow bandpass filter and an output terminal;

second output transistor means having an input terminal connected to the second output terminal of the double balanced mixer circuit and an output terminal connected to the output terminal of the first transistor means;

transistor switch means responsive to an external signal to alternatively activate the first transistor means only when the first IF signal is an AM signal and the second IF transistor means only when the first IF signal is an FM signal, whereby only AM signals are passed through the narrow bandpass filter and the DC output voltage of the first or second transistor means is identical regardless of the transistor switch means condition.

4. The mixer of claim 3 in which:

the first output transistor means comprises a first output transistor having a collector connected to the supply voltage, a base for the input terminal and an emitter connected to a third transistor current source means and a second output transistor having a base coupled to the emitter of the first output transistor, a collector connected to the supply voltage and an emitter providing the output terminal;

the second output transistor means comprises a third output transistor having a collector connected to the supply voltage, a base for the input terminal and an emitter connected to a fourth transistor current source means and a fourth output transistor having a base coupled to the emitter of the third output transistor, a collector connected to the supply voltage and an emitter providing the output terminal; and the transistor switch means comprises a first switch transistor having a grounded emitter, a collector connected to the base of the fourth output transistor and a base effective to receive the external signal, a second switch transistor having a grounded emitter, a collector connected to the base of the second output transistor and a base and a third switch transistor having a grounded emitter, a collector connected to an active load and to the base of the second switch transistor and a base connected to the base of the first switch transistor.

* * * * *